(12) United States Patent
Cok

(10) Patent No.: US 7,498,735 B2
(45) Date of Patent: Mar. 3, 2009

(54) OLED DEVICE HAVING IMPROVED POWER DISTRIBUTION

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 98 days.

(21) Appl. No.: 11/253,909

(22) Filed: Oct. 18, 2005

(65) Prior Publication Data

US 2007/0085471 A1 Apr. 19, 2007

(51) Int. Cl.
H01J 1/62 (2006.01)
(52) U.S. Cl. ........................ 313/503; 313/506
(58) Field of Classification Search ............... 313/498, 313/501, 503, 504, 506, 112, 113
See application file for complete search history.

(56) References Cited

U.S. PATENT DOCUMENTS

| 6,396,208 | B1 | 5/2002 | Oda et al. | |
| 6,812,637 | B2 * | 11/2004 | Cok et al. | 313/503 |
| 2001/0026124 | A1 | 10/2001 | Liu et al. | |

FOREIGN PATENT DOCUMENTS

| EP | 1 463 117 | 9/2004 |
| EP | 1 720 207 | 11/2006 |
| JP | 2000-231985 | 8/2000 |
| WO | WO 02/35780 | 5/2002 |
| WO | WO 02/37580 | 5/2002 |
| WO | WO 2005/114762 | 12/2005 |

* cited by examiner

*Primary Examiner*—Bao Q Truong
(74) *Attorney, Agent, or Firm*—Andrew J. Anderson; Raymond L. Owens (57) ABSTRACT

An organic light-emitting diode (OLED) device, comprising: a first electrode and a second electrode having one or more organic layers formed there-between, at least one organic layer being light-emitting, the first and second electrodes defining one or more light-emissive areas; wherein at least one of the first and second electrodes comprises reflective and transparent portions in the light emissive area, the transparent portion being a relatively lower electrically conductive portion so that light emitted by the light-emitting organic layer passes through the transparent portion and the reflective portion being a relatively higher electrically conductive portion for reflecting emitted light, and wherein at least one reflective portion is located in the light-emissive area such that a transparent portion is formed in the light-emissive area between the at least one reflective portion and any reflective portion formed between the one or more light-emissive areas.

20 Claims, 7 Drawing Sheets

OLED DEVICE HAVING IMPROVED POWER DISTRIBUTION

FIELD OF THE INVENTION

The present invention relates to organic light-emitting diode (OLED) devices, and more particularly, to OLED device structures for improving light output, contrast, and power distribution.

BACKGROUND OF THE INVENTION

Organic light-emitting diodes (OLEDs) are a promising technology for flat-panel displays and area illumination lamps and backlights. Applications of OLED devices include active-matrix image displays, passive-matrix image displays, and area-lighting devices such as, for example, selective desktop lighting. Irrespective of the particular OLED device configuration tailored to these broad fields of applications, all OLEDs function on the same general principles. An organic electroluminescent (EL) medium structure is sandwiched between two electrodes. At least one of the electrodes is at least partially light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the OLED is said to be forward-biased. Positive charge carriers (holes) are injected from the anode into the EL medium structure, and negative charge carriers (electrons) are injected from the cathode. Such charge carrier injection causes current flow from the electrodes through the EL medium structure. Recombination of holes and electrons within a zone of the EL medium structure results in emission of light from this zone that is, appropriately, called the light-emitting zone or interface. The organic EL medium structure can be formed of a stack of sublayers that can include small molecule layers or polymer layers. Such organic layers and sublayers are well known and understood by those skilled in the OLED art.

Full-color OLED devices may employ a variety of organic materials to emit different colors of light. In this arrangement, the OLED device is patterned with different sets of organic materials, each set of organic materials associated with a particular color of light emitted. Each pixel in an active-matrix full-color OLED device typically employs each set of organic materials, for example to form a red, green, and blue sub-pixel. The patterning is typically done by evaporating layers of organic materials through a mask. In an alternative arrangement, a single set of organic materials emitting broad-band light may be deposited in continuous layers with arrays of differently colored filters employed to create a full-color OLED device. In addition, black-matrix materials may be employed between the color filters in non-emissive areas of the OLED device to absorb ambient light and thereby improve the contrast of the OLED device. Such color filter and black-matrix materials are known in the art and are employed, for example, in the LCD industry. The contrast improvement possible by providing a black-matrix material between light-emitting areas of the OLED device is limited by the relative size of the light-emitting areas and the areas between the light-emitting areas, i.e. the fill factor of the OLED device.

The emitted light is directed towards an observer, or towards an object to be illuminated, through the light transmissive electrode. If the light transmissive electrode is between the substrate and the light emissive elements of the OLED device, the device is called a bottom-emitting OLED device. Conversely, if the light transmissive electrode is not between the substrate and the light emissive elements, the device is referred to as a top-emitting OLED device. The present invention may be directed to either a top-emitting or bottom-emitting OLED device. However, in one embodiment, because of the limitations on a transparent electrode that are overcome in the present invention, a top-emitting OLED device is preferred.

In top-emitting OLED devices, light is emitted through an upper electrode or top electrode, typically but not necessarily the cathode, which has to be sufficiently light transmissive, while the lower electrode(s) or bottom electrode(s), typically but not necessarily the anode, can be made of relatively thick and electrically conductive metal compositions which can be optically opaque. Because light is emitted through an electrode, it is important that the electrode through which light is emitted be sufficiently light transmissive to avoid absorbing the emitted light. Typical prior-art materials proposed for such electrodes include indium tin oxide (ITO) and very thin layers of metal, for example silver or aluminum or metal alloys including silver or aluminum. However, the current carrying capacity of such electrodes is limited, thereby limiting the amount of power that can be supplied to the OLED materials, and hence the amount of light that can be emitted from the organic layers.

Figure 11:
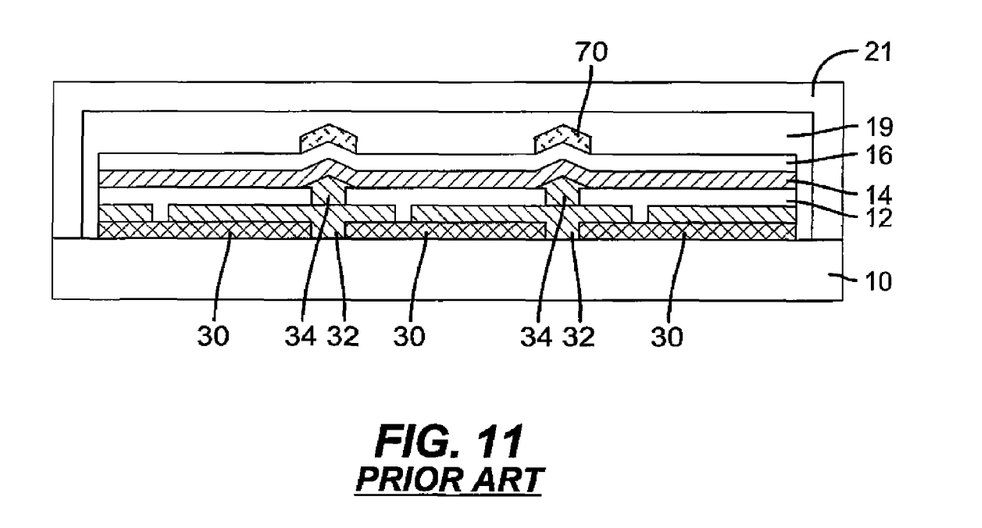
FIG. 11 is a cross section of a top-emitter OLED device having an auxiliary electrode as described in the prior art.

Referring to FIG. 11, a top-emitting OLED device as suggested by the prior art is illustrated having a substrate 10 (either reflective, transparent, or opaque). Over the substrate 10, a semiconducting layer is formed providing thin-film electronic components 30 for driving an OLED. An interlayer insulating and planarizing layer 32 is formed over the thin-film electronic components 30 and a patterned reflective electrode 12 defining OLED light-emissive elements is formed over the insulating layer 32. An inter-pixel insulating film 34 separates the elements of the patterned reflective electrode 12. One or more first layers 14 of organic material, one of which emits light, are formed over the patterned reflective electrode 12. A transparent second electrode 16 is formed over the one or more first layers 14 of organic material. A gap 19 separates the transparent second electrode 16 from an encapsulating cover 20. The encapsulating cover 20 is transparent and may be coated directly over the transparent electrode 16 so that no gap 19 exists. In some prior-art embodiments, the first electrode 12 may instead be at least partially transparent and/or light absorbing. Because suitable transparent conductors, for example ITO, have a limited conductivity, the current that may be passed through the organic layers 14 is limited and the uniformity of the light-emitting areas in an OLED device may be adversely affected by differences in current passed through various portions of the transparent conductor 16. As taught in issued U.S. Pat. No. 6,812,637 entitled "OLED Display with Auxiliary Electrode" Cok, an auxiliary electrode 70 may be provided between the light-emitting areas of the OLED to improve the conductivity of the transparent electrode and enhance the current distribution in the OLED. For example, a thick, patterned layer of aluminum or silver or other metals or metal alloys may be employed. However, the thick patterned layer of metal may not be transparent, requiring the auxiliary electrode 70 to be located between the light-emitting areas, limiting its conductivity and restricting the manufacturing tolerances of the OLED, thereby increasing costs. Likewise, a typical black matrix supplied over the OLED device is similarly limited to locations between the light-emitting areas, reducing the contrast of the OLED device.

A top-emitter OLED device as illustrated in FIG. 11 typically uses a glass substrate, a reflective conducting first electrode 12 comprising a metal, for example aluminum or silver, a stack of organic layers, and transparent conducting second electrode 16 employing, for example, indium-tin-oxide (ITO). Light generated from the device is emitted through the transparent electrode 16. In these typical devices, the index of the ITO layers, the organic layers, and the glass is about 2.0, 1.7, and 1.5 respectively. It has been estimated that nearly 50% of the generated light is trapped by internal reflection in the ITO/organic EL element, 25% is trapped in the glass substrate, and only about 25% of the generated light is actually emitted from the device and performs useful functions.

A variety of techniques have been proposed to improve the out-coupling of light from thin-film light emitting devices. For example, Chou (International Publication Number WO 02/37580 A1) and Liu et al. (U.S. Patent Application Publication No. 2001/0026124 A1) teach the use of a volume or surface scattering layer to improve light extraction. The scattering layer is applied next to the organic layers or on the outside surface of the glass substrate and has an optical index that matches these layers. Light emitted from the OLED device at higher than critical angle that would have otherwise been trapped can penetrate into the scattering layer and be scattered out of the device. The efficiency of the OLED device is thereby improved but trapped light may propagate a considerable distance horizontally through the cover, substrate, or organic layers before being scattered out of the device, thereby reducing the sharpness of the device in pixellated applications such as displays.

There is a need, therefore, for an improved organic light-emitting diode device structure that improves the power distribution over the OLED device and within light-emissive areas of the OLED device, contrast, light output, and sharpness of an OLED device.

SUMMARY OF THE INVENTION

In accordance with one embodiment, the invention is directed towards an organic light-emitting diode (OLED) device, comprising:

a first electrode and a second electrode having one or more organic layers formed there-between, at least one organic layer being light-emitting, the first and second electrodes defining one or more light-emissive areas;

wherein at least one of the first and second electrodes comprises reflective and transparent portions in the light emissive area, the transparent portion being a relatively lower electrically conductive portion so that light emitted by the light-emitting organic layer passes through the transparent portion and the reflective portion being a relatively higher electrically conductive portion for reflecting emitted light, and wherein at least one reflective portion is located in the light-emissive area such that a transparent portion is formed in the light-emissive area between the at least one reflective portion and any reflective portion formed between the one or more light-emissive areas.

ADVANTAGES

Various embodiments of the present invention have advantages of improving the power distribution over the OLED device and within light-emissive areas of the OLED device, contrast, light output, and sharpness of an OLED device.

BRIEF DESCRIPTION OF THE DRAWINGS

It will be understood that the figures are not to scale since the individual layers are too thin and the thickness differences of various layers too great to permit depiction to scale.

DETAILED DESCRIPTION OF THE INVENTION

Figure 1:
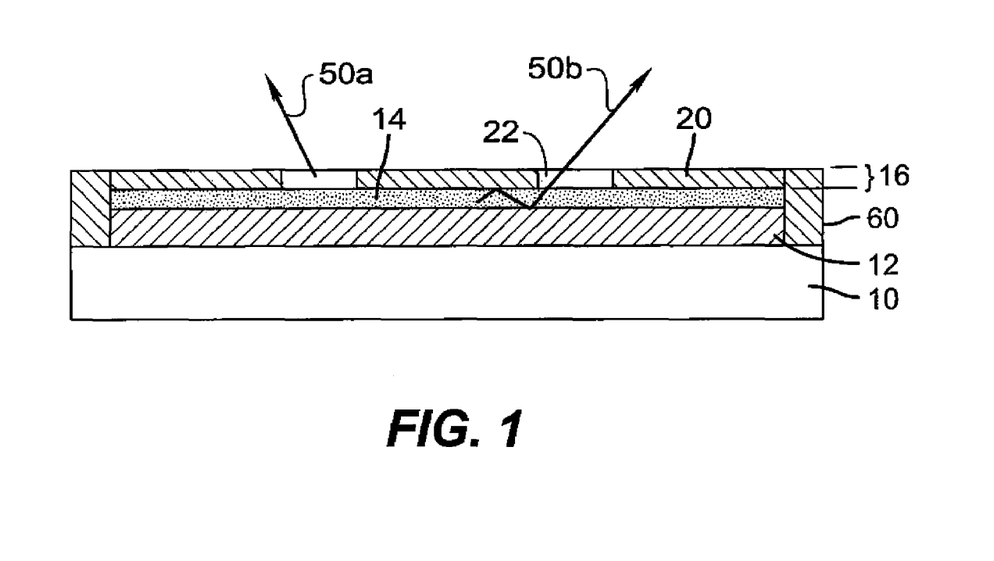
FIG. 1 is a partial cross section of a top-emitter OLED device according to an embodiment of the present invention.

Referring to FIG. 1, in one top-emitting embodiment of the present invention, an organic light-emitting diode (OLED) device comprises first a second electrodes 12 and 16 having one or more organic layers 14 formed there-between, at least one organic layer being light-emitting, the coextensive conductive areas of the first and second electrodes 12 and 16 defining one or more light-emissive areas. In the illustrated embodiment, electrode 16 comprises reflective 20 and transparent 22 portions in the light emissive area, the transparent portion 22 being a relatively lower electrically conductive portion so that light 50a emitted by the light-emitting organic layer passes through the transparent portion and the reflective portion 20 being a relatively higher electrically conductive portion for reflecting emitted light 50b. Either the first or second electrodes 12 or 16 may be formed on a substrate 10. Reflective edges 60 may be employed to prevent light escaping from the light-emitting area defined by the first and second electrodes 12 and 16. Electrode 16 includes at least one relatively more conductive reflective portion 20 located in the light-emissive area such that a transparent portion 22 is formed in the light-emissive area between the at least one reflective portion 20 and any reflective portion formed between the one or more light-emissive areas, so that current distribution may be improved within the light-emissive area.

Figure 2:
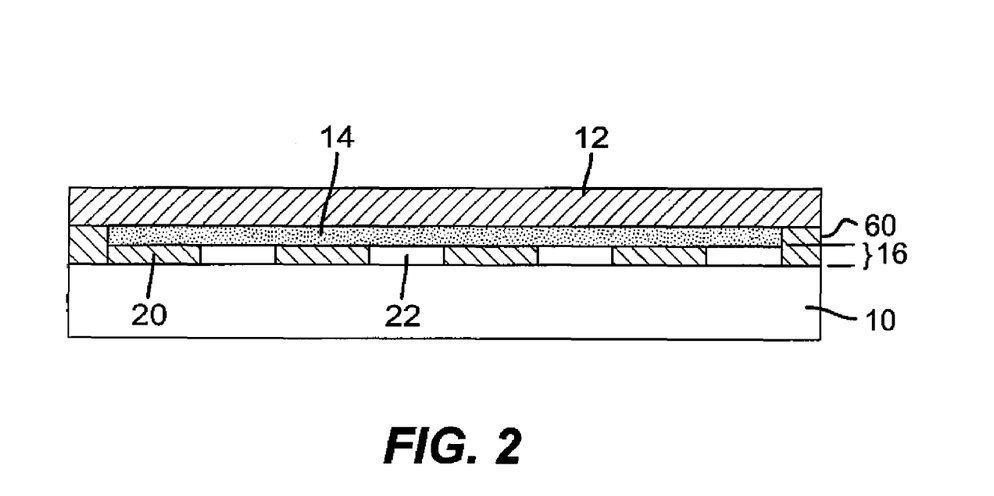
FIG. 2 is a partial cross section of a bottom-emitter OLED device according to an embodiment of the present invention.

In the top-emitting embodiment of FIG. 1, electrode 12 is located between the substrate 10 and the organic layers 14 and light is emitted from the OLED through an encapsulating cover (not shown). Referring to FIG. 2, a bottom-emitting embodiment of the present invention locates electrode 16 between the substrate 10 and the organic layers 14 and light is emitted from the OLED through the substrate. In FIGS. 1 and 2, electrode 16 is patterned and formed in a single layer with distinct transparent and reflective portions 22 and 20 respectively that may be formed through patterned material deposition, for example by evaporation or sputtering through a mask. Alternatively, patterned portions may be formed by patterned removal of material, e.g., by photolithography. The reflective materials may comprise metal (for example, silver, aluminum, or magnesium) or metal alloys while the transparent materials may comprise metal oxides, for example indium tin oxide. These materials are well known, as are patterned deposition and removal techniques.

The transparent portions 22 of electrode 16 may be any shape or size and may include multiple non-contiguous transparent areas, for example rectangular or circular holes through which light may be emitted by the organic materials 14. By transparent is meant that light of the desired frequency may pass through. The transparent portions 22 of the present invention can include filters, for example color or neutral density filters but, according to the present invention, the transparent portions 22 must transmit a greater portion of the emitted light than the reflective portions 20 of electrode 16. Likewise, the reflective portions 20 must reflect a greater portion of the emitted light than the transparent portions 22 of electrode 16. Preferably, the transparent portions 22 are equal to or greater than 1 micron in at least one dimension to facilitate light transmission through the transparent portions 22 for frequencies of light less than 1 micron in wavelength. In general, it is preferred that a plurality of separated transparent portions 22 be provided so that emitted light passing through the transparent portion 22 is not significantly absorbed before it reaches the transparent portion 22.

Figure 3A:
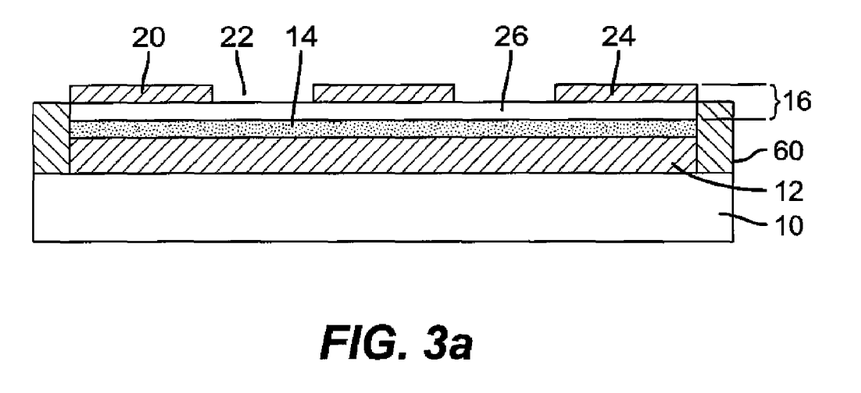
FIGS. 3a and 3b are partial cross sections of top-emitter OLED devices with two different bi-layer electrodes according to alternative embodiments of the present invention.
Figure 3B:
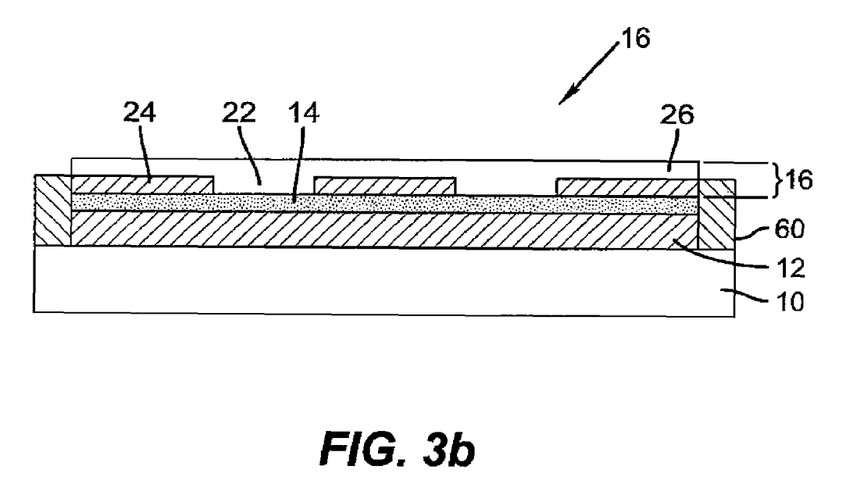

Referring to FIG. 3a, in an alternative embodiment of the present invention, electrode 16 comprises two layers. The first layer is a transparent conductive layer 26 formed adjacent to the organic layers 14 and the second layer is a patterned reflective conductive layer 24 formed and patterned over the transparent conductive layer 26. The coextensive areas of patterned reflective conductive layer 24 and transparent conductive layer 26 define the reflective portions 20 of electrode 16. This arrangement has the advantage of not requiring patterned deposition of the transparent portion 22 of electrode 16. The transparent conductive layer 26 is preferably continuous so as to provide current to all portions of the organic layers 14. The second reflective, conductive layer 24 need not be continuous and may preferably be discontinuous to enhance patterning in the manufacturing process. Referring to FIG. 3b, the reflective, conductive layer 24 may be patterned and deposited first and the transparent conductive layer 26 may be deposited over the entire surface including the back of the reflective, conductive layer 24.

Figure 4:
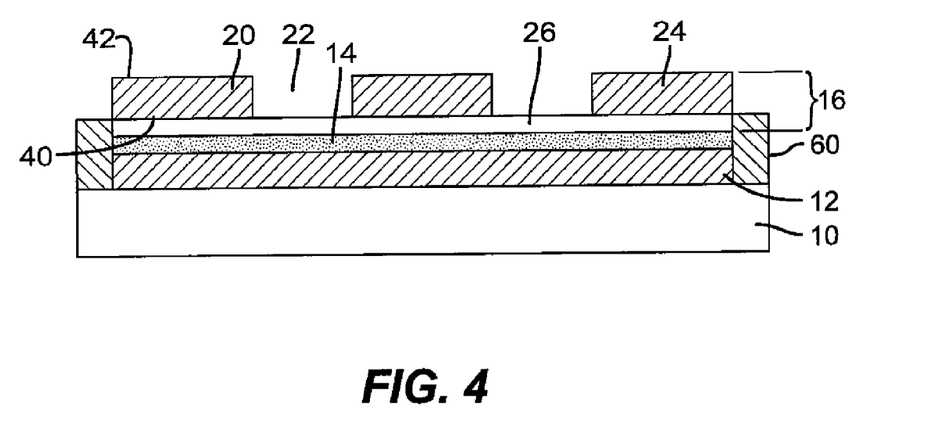
FIG. 4 is a partial cross section of a top-emitter OLED device with a bi-layer electrode having layers of different thickness according to an alternative embodiment of the present invention.

Referring to FIG. 4, in various embodiments of the present invention, the patterned conductive layer 24 defining reflective portions 20 of electrode 16 may have two sides, one side being reflective and having a reflective surface 40 for reflecting emitted light and a second side being light-absorbing and having a light absorbing surface 42 for absorbing ambient light. The reflective surface 40 faces toward the light-emitting organic layers 14 and reflects emitted light. The light-absorbing surface 42 faces toward a view of the OLED device and is exposed to ambient light. By forming a light-absorbing surface on the reflective portion 20, ambient light is absorbed and the contrast of the OLED device is increased. The contrast is limited by the percentage of electrode 16 area that is light absorbing compared to the transparent portion 22. As the transparent portion 22 is reduced, the contrast is increased. Since the present invention employs an auxiliary electrode in the light emissive area, it increases the percentage of area that may be coated by light-absorbing materials, and enables an OLED device having improved contrast. Suitable materials that may be coated on patterned conductive layer 24 for absorbing light to provide a light-absorbing surface 42 can include, for example a metal oxide, metal sulfide, silicon oxide, silicon nitride, carbon, a light-absorbing polymer, a polymer doped with an absorbing dye, or combinations thereof. Preferably, the light-absorbing material is black, e.g., carbon black and can include further anti-reflective coatings.

Figure 5:
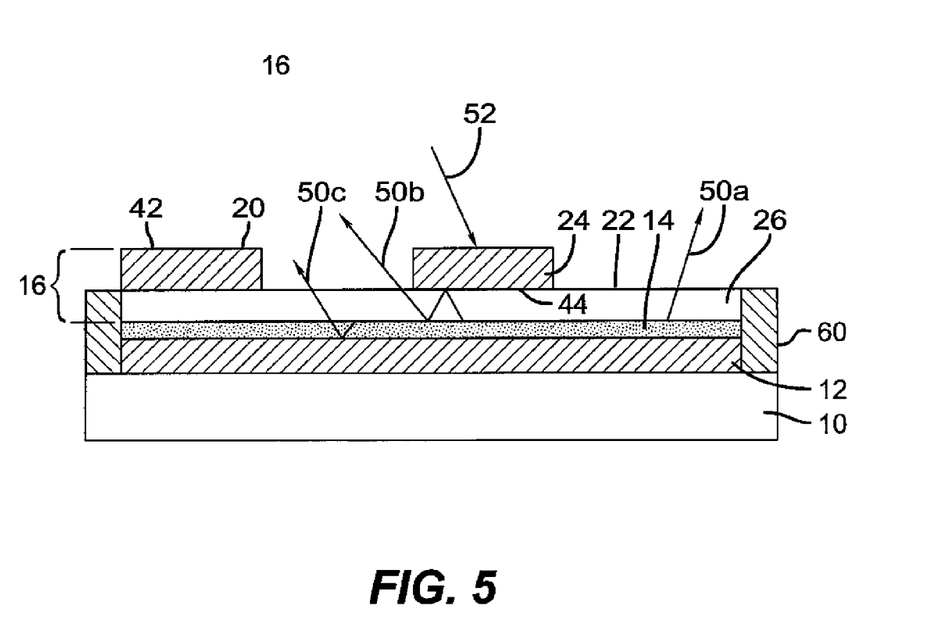
FIG. 5 illustrates the path of light rays within a partial cross section of a top-emitter OLED according to an embodiment of the present invention.

Referring to FIG. 5, in operation current is supplied through electrodes 12 and 16. The current flows through the organic layers causing them to emit light. Light 50c emitted toward the electrode 12 is reflected. Light 50a emitted toward the transparent portion 22 is directly emitted. Light 50b emitted toward the reflective portions 20 is reflected toward electrode 12 and alternately encounters the reflective portions 20 and the electrode 12 until the light is emitted through a transparent portion 22 and escapes from the OLED. Because electrode 12 is reflective in this embodiment, light emitted beneath the reflective portions 20 is not lost, but eventually escapes from the OLED. Hence, although in practice some emitted light may be absorbed by the organic layers and the electrode 12 and reflective portions 20, the present invention will emit nearly the same amount of light as a conventional OLED design but employing an apparently smaller emissive area.

Figure 12:
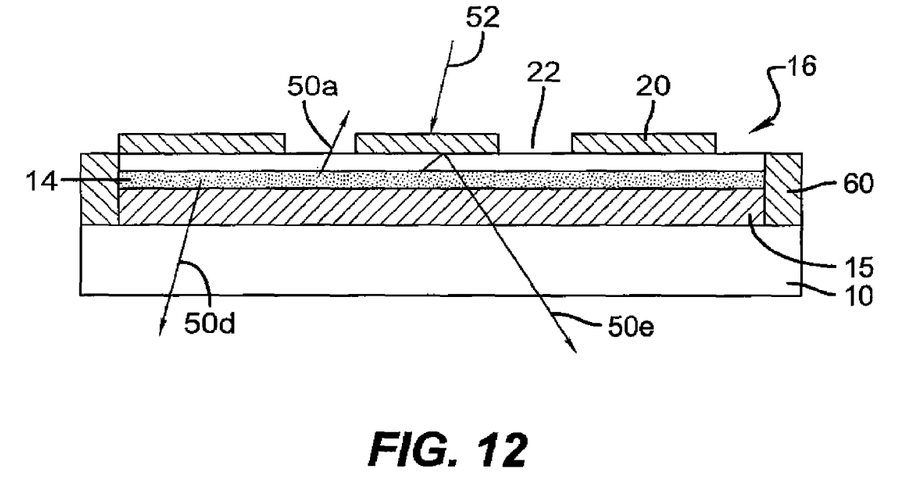
FIG. 12 is a cross section of an OLED device emitting light bi-directionally according to an embodiment of the present invention.

In various embodiments of the present invention, electrode 12 may be reflective (as illustrated in FIGS. 1, 2, and 5). In an alternative embodiment, as illustrated in FIG. 12, a transparent electrode 15 may be employed with electrode 16, so that emitted light may pass directly through it (50d) or be reflected (50e) from the reflective portions 20 of electrode 16 without repeated reflections. In yet another embodiment, the electrode 12 may also comprise reflective 20 and transparent 22 portions similar to those of electrode 16. In such embodiment, the potions may be aligned so that the transparent portions 22 of one electrode are located opposite the reflective portions 20 of the other electrode, or may be aligned so that the transparent portions 22 and the reflective portions 20 of one electrode are located opposite the same type portions of the other electrode.

As shown in FIG. 5, ambient light 52 incident upon an OLED device of the illustrated embodiment of the present invention may be absorbed by the light-absorbing surface 42 of the patterned layer 24. Alternatively, the ambient light may pass through a transparent portion 22 and eventually be re-emitted from the OLED device as unwanted, reflected light.

The physical limit of the contrast improvement possible according to various embodiments of the present invention will be limited by the actual light absorption of the material layers 14 in the OLED and by losses due to imperfect reflection by the reflective electrode 12 or the reflective portions 24 of electrode 16. These absorptions and imperfect reflections will also reduce the amount of emitted light that passes out of the OLED device. According to one embodiment of the present invention, the light-absorbing surface 42 of patterned reflective layer 24 will improve the ambient contrast of the OLED device in direct proportion to the light-absorbing area percentage of the electrode 16.

In any practical implementation of a useful OLED device, there must be at least one transparent portion 22 for each light-emitting area in the OLED device. Hence, the minimum number of openings and the maximum spacing of the transparent portions 22 are defined by the OLED device configuration. In general, it is useful to have several transparent portions 22 per light-emitting area or pixel. The size and shape of the transparent portions 22 are not critical and may be determined by practical limitations in the manufacture of the OLED device. Since light may be absorbed by the organic layers 14 or imperfectly reflected from the reflective electrode 12 or reflective portion 24, it is preferred that many holes be provided for each light-emitting area. For example, in an OLED device having a plurality of light-emitting areas defined by a patterned electrode of 50 microns by 200 microns, it may be preferred to provide 5 micron-diameter holes on 20-micron centers to provide an approximately 20% black-matrix fill factor. Such relative light-emitting area and transparent hole sizes will enable electrode 16 to include reflective portions 20 located in the light-emissive area such that a transparent portion 22 is formed in the light-emissive area between the at least one reflective portion 20 and any reflective portion formed between light-emissive areas, so that current distribution may be improved within the light-emissive area. Alternatively, it may be preferred to provide 3 micron-diameter holes on 12-micron centers to provide a similar black-matrix fill factor. The more frequently spaced openings may decrease the light absorption in the OLED device.

Figure 6:
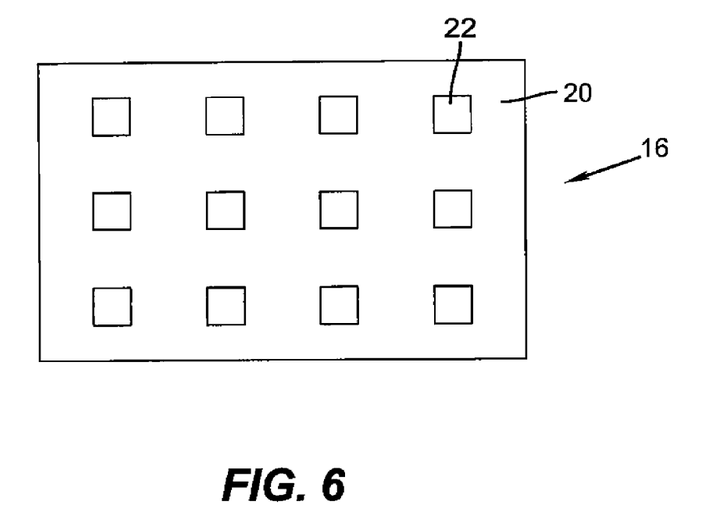
FIG. 6 is a top-view of a bi-layer electrode according to an embodiment of the present invention.
Figure 7:
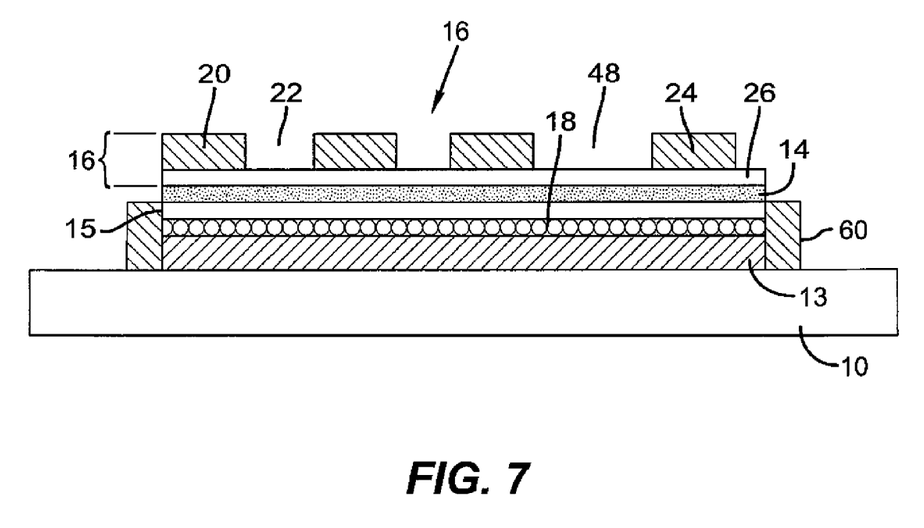
FIG. 7 is a partial cross section of a top-emitter OLED device having a scattering layer according to yet another embodiment of the present invention.
Figure 8:
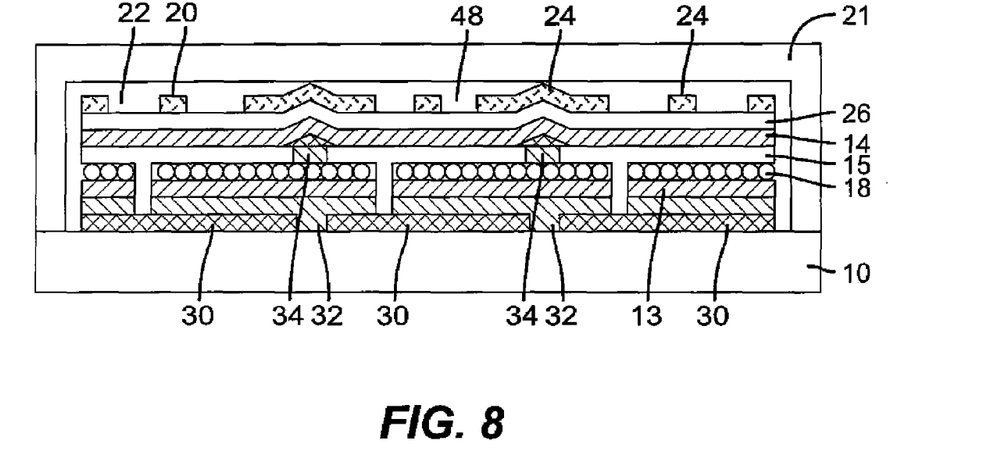
FIG. 8 is a cross section of a top-emitter OLED device having an auxiliary electrode and a scattering layer according to an alternative embodiment of the present invention.

FIG. 6 illustrates a top view of an OLED device according to various embodiments of the present invention. The transparent portions 22 may be formed, for example, as columns or rows extending the length of the light-emitting area of the OLED, as a rectangle (as shown), or as circles and may be formed in a regular array or randomly. The distribution of the transparent openings 22 over the surface may be different in different dimensions. Essentially, any shape or distribution of transparent openings 22 may be employed. As shown in FIG. 7, the transparent openings may be irregular and/or not regularly aligned with the light-emissive areas and may be located in different positions over different light-emissive areas. Alternatively, as shown in FIG. 8, the reflective portions 20 may be regularly patterned, and cover, e.g., the non-light-emitting areas, a contiguous portion of the edges of the light-emitting areas defined by the patterned second electrode, and a portion of the light-emissive area located between the edges of the light-emissive area. Patterning of the more conductive reflective portion 20 may be designed so that current distribution may be optimized and made more uniform within the light-emissive area.

According to the present invention, the reflective portion 20 or layer 24 is more conductive than the transparent portion 22 and may comprise a metal, for example silver, aluminum, magnesium, or metal alloys. The more conductive material will distribute current through the second electrode 16 much more efficiently than the less conductive transparent portions 22 (typically made of metal oxides such as ITO). Alternatively, the transparent and reflective portions may be made of the same material, for example aluminum or silver or other metals or metal alloys, but the transparent portion 22 may be much thinner (for example less than 100 nm thick and hence largely transparent) than the thicker, reflective portion 20. Since the present invention increases the percentage of area that may be coated by more conductive materials (for example metal coatings greater than 100 nm thick and preferably more than 400 nm and more preferably 1 micron), it provides an OLED device having improved power distribution. In particular, the reflective portion 24 of the electrode 16 may be thicker than the transparent portion 22.

Referring again to FIGS. 7 and 8, in alternative further embodiments of the present invention, a scattering layer 18 may be optically integrated with the electrodes 12 and 16 respectively and the organic layers 14. As described in co-pending, commonly assigned Ser. No. 11/065,082, filed Feb. 24, 2005, the disclosure of which is hereby incorporated by reference, light emitted by the organic layers of an OLED may be trapped within the OLED device and a scattering layer may be employed to scatter the trapped light out of the OLED device. As employed herein, a light scattering layer 18 is an optical layer that tends to randomly redirect any light that impinges on the layer from any direction. Optically integrated means that light emitted by the organic layers 14 encounters the scattering layer 18 before traveling through other layers having an optical index lower than those of the organic materials or electrodes.

The scattering layer 18 may be formed only in the areas where the transparent portions 22 are located or, alternatively, may be located over the entire light-emitting area or only in areas where the reflective portions 20 are located. The scattering layer 18 may be formed, for example as shown in FIGS. 7 and 8, between a transparent conductive layer 15 and a reflective layer 13. The transparent conductive layer 15 is formed between the scattering layer 18 and the organic layers 14. Light either emitted or reflected toward the reflective layer 13 will be scattered. In this way, light that normally waveguides between the electrodes through the transparent electrode materials and the organic layers 14 is scattered into a direction that may allow the waveguided light to escape through a transparent portion 22 and escape from the OLED device, thereby increasing the light output of the OLED device. Alternatively, a reflective electrode 12 having a rough surface that randomly redirects light incident upon it or incorporating light refracting particles may be employed as a scattering layer.

Figure 9:
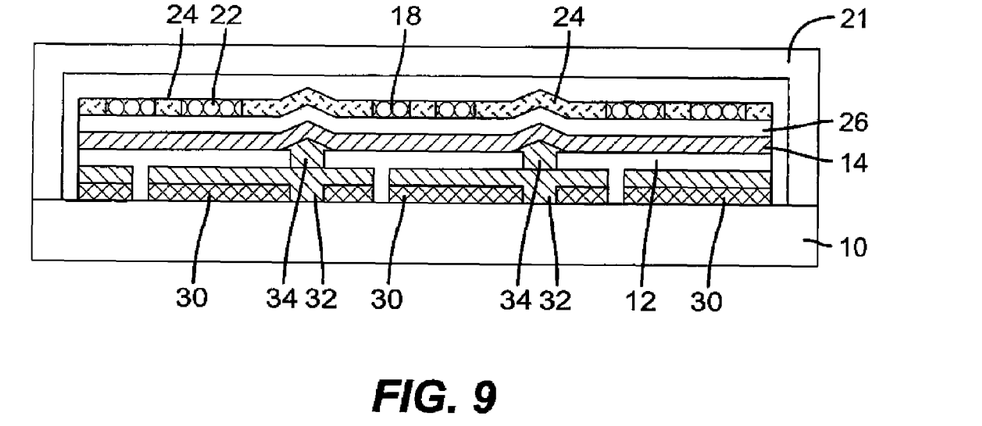
FIG. 9 is a cross section of a top-emitter OLED device having an auxiliary electrode and a scattering layer above a transparent layer according to an embodiment of the present invention.

Referring to FIG. 9, in an alternative embodiment of the present invention, a scattering layer 18 may be formed in, above, or beneath the transparent portions 22. In this arrangement, the scattering particles may also be formed over the reflective portions 20, as necessary to enable ease of manufacturing, since subsequent layers do not then have to be formed over the irregular surface of a scattering layer.

Scattered light, when directed into a thick layer, may travel a significant distance by total internal reflection in a pixilated device, thereby reducing the sharpness of such a device. In a further embodiment of the invention, the reflective portions 20 of electrode 16 are preferably thicker than the transparent portions 22, providing spacing between the transparent portion and the cover or substrate though which light is emitted. By providing a low-index element 48 having an optical index lower than the index of the organic layers 14 or any cover 21 or substrate 10 in the spaces formed by differences in height between the reflective portions 20 and the transparent portions 22, any light that escapes from the OLED layers 14 and the electrodes 12 and 16 and passes through the low-index element before entering any other layer cannot be totally internally reflected in the other layers, thereby increasing the sharpness of the OLED device. In particular, if a low-index element 48 is provided between the OLED materials 14, electrodes 12 and 16, and scattering layer 18 and the substrate or cover, light cannot be totally internally reflected within the substrate 10 or cover 21, thereby enhancing the sharpness of the OLED device. Referring to FIGS. 7 and 8, the spaces between the reflective layer 24 through which light escapes may be filled with a low-index element 48, for example a gas such as air, nitrogen, or argon. Preferably, the difference in height between reflective portions 20 and transparent portions 22 is at least one micron so that visible light may effectively transmit through the low-index element.

Figure 10:
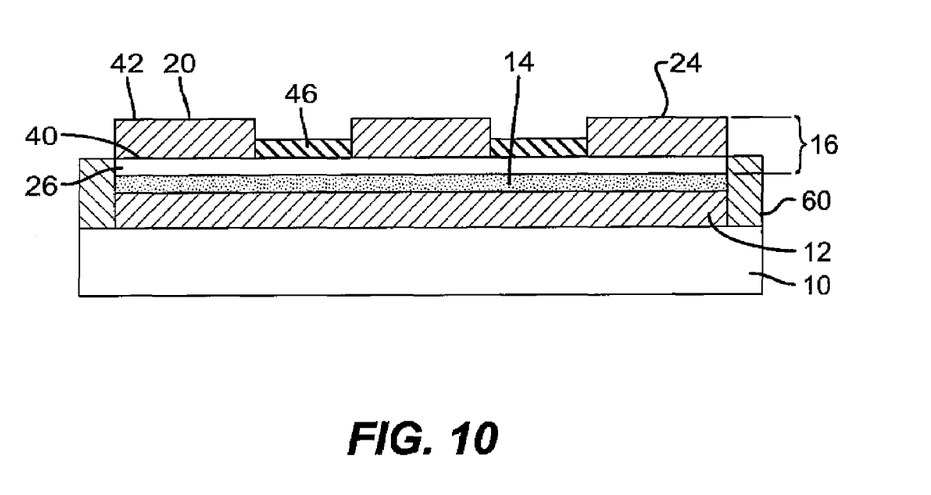
FIG. 10 is a partial cross section of a top-emitter OLED device having an auxiliary electrode and color filters according to another embodiment of the present invention.

Referring to FIG. 10, in further embodiments of the present invention, a color filter 46 may be aligned with and located in or above the transparent portion 22 to filter the light output from the OLED device. The OLED organic layers 14 may either emit a colored light or a broadband (primarily white) light and the color filter may be employed to provide an appropriate color of light, for example to provide a full-color OLED display. In various embodiments, the color filter 46 may be located on the OLED above or below a scattering layer, or formed on the cover or substrate of a top-emitting or bottom-emitting OLED device, respectively. Color filters are known in the art and may include, for example, pigments or dyes formed in or on a base material, for example various protective layers such as glass, silicon or silicon-based materials, polymers, or metal oxides. Neutral density filters may also be employed.

Alternatively, a color filter may be located over the entire extent of the electrode 16. The color filter 46 may be formed on a scattering layer, if present, or on a transparent electrode or any protective or encapsulating layers formed on a transparent electrode or formed on the cover or substrate of a top-emitting or bottom-emitting OLED device, respectively. In this case, both emitted and ambient light that is reflected within the OLED device may pass through the filter multiple times.

The scattering layer 18 should be in optical contact with the light emitters in order to effectively enhance the light output of the OLED device. By optical contact is meant that there are no intervening layers having an optical index lower than the optical index of any of the organic and transparent electrode layers and that light that passes through any one of the layers will encounter the scattering layer. The one or more organic layers may include one or more of the following layers: a hole-injection layer, hole-transport layer, electron-injection layer, electron-transport layer, and a light-emitting layer. More than one light-emitting layer may be employed in the present invention, for example to create a white-light output. These layers are well known in the OLED art.

Although OLED layer structures have been primarily described with a cathode on the top and an anode on the bottom near the substrate, it is well known that the organic layers can be inverted and the positions of the anode and cathode exchanged. Both such structures are included in the present invention.

Various conductive and scattering materials useful in the present invention, as well as the employment of scattering layers for extracting additional light from the device are further described in co-pending, commonly assigned U.S. Ser. No. 11/065,082, filed Feb. 24, 2005, incorporated by reference above. Additional layers may be usefully employed with the present invention. For example, one problem that may be encountered with scattering layers is that the electrodes may tend to fail open at sharp edges associated with the scattering elements in the scattering layer. Although the scattering layer may be planarized, typically such planarizing operations do not form a perfectly smooth, defect-free surface. To reduce the possibility of shorts between the transparent electrodes, a short-reduction layer may be employed over a scattering layer. Such a layer is a thin layer of high-resistance material (for example having a through-thickness resistivity between $10^{-7}$ ohm-cm$^2$ to $10^3$ ohm-cm$^2$). Because the short-reduction layer is very thin, device current can pass between the electrodes through the device layers but leakage current through the shorts are much reduced. Such layers are described in co-pending, commonly assigned U.S. Ser. No. 10/822,517, filed Apr. 12, 2004, the disclosure of which is incorporated herein by reference.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation. Atomic layer deposition may be employed to provide encapsulation, for example as described in copending, commonly assigned U.S. Ser. No. 11/122,295, filed Apr. 5, 2005, the disclosure of which is incorporated by reference herein. These encapsulation layers may be formed over the transparent electrode either under or over any of the scattering layers or color filter layers. For example, a protective layer, for example an encapsulating layer formed by atomic layer deposition and/or a layer of parylene, may be formed over electrode 16.

The present invention may also be employed with four-sub-pixel display designs for example, having a red, green, blue, and white emitter. A neutral density filter may be located over any of the emitters, but in particular may be employed with a white emitter to improve device contrast. Such color or neutral density filters may be located in any of the transparent openings taught herein.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

| PARTS LIST | |
|---|---|
| 10 | substrate |
| 12 | electrode |

-continued

| PARTS LIST | |
|---|---|
| 13 | reflective layer |
| 14 | organic layer(s) |
| 15 | transparent electrode |
| 16 | electrode |
| 18 | scattering layer |
| 19 | gap |
| 20 | reflective portion |
| 21 | cover |
| 22 | transparent portion |
| 24 | patterned reflective conductive layer |
| 26 | transparent conductive layer |
| 30 | thin-film circuitry |
| 32 | insulator |
| 34 | insulator |
| 40 | reflective surface |
| 42 | light-absorbing surface |
| 46 | color filter |
| 48 | low-index element |
| 50a, 50b, 50c, 50d, 50e | emitted light rays |
| 52 | ambient light ray |
| 60 | reflective edge |
| 70 | auxiliary electrode |

The invention claimed is:

1. An organic light-emitting diode (OLED) device, comprising:
    a first electrode and a second light-reflecting electrode; one or more organic layers formed there-between, at least one organic layer being light-emitting; the first and second electrodes defining one or more light-emissive areas separated by inter-pixel insulating film elements; and
    wherein the first electrode comprises an electrically conductive reflective portion and an electrically conductive transparent portion through which light is emitted disposed over the one or more light emissive areas between the inter-pixel insulating film elements within the light-emissive areas, the transparent portion being a relatively lower electrically conductive portion than the reflective portion, so that light emitted by the light-emitting organic layer passes through the transparent portion and is reflected between the second electrode and the reflective portion until passing through the transparent portion.

2. The organic light-emitting diode (OLED) device of claim 1, wherein the reflective portion comprises two sides, one side being reflective for reflecting emitted light and the other being light-absorbing for absorbing ambient light.

3. The organic light-emitting diode (OLED) device of claim 1, wherein the reflective portion comprises a metal layer at least 100 nm thick.

4. The organic light-emitting diode (OLED) device of claim 1, wherein the transparent portion includes multiple non-contiguous transparent portions.

5. The organic light-emitting diode (OLED) device of claim 1, wherein the reflective portion is thicker than the transparent portion.

6. The organic light-emitting diode (OLED) device of claim 1, wherein the first electrode comprises a first transparent conductive layer providing the transparent portion and a second patterned reflective conductive layer providing the reflective portion.

7. The organic light-emitting diode (OLED) device of claim 6, wherein the first transparent conductive layer is between the one or more organic layers and the second patterned reflective conductive layer.

8. The organic light-emitting diode (OLED) device of claim 6, wherein the second patterned reflective conductive layer is between the one or more organic layers and the first transparent conductive layer.

9. The organic light-emitting diode (OLED) device of claim 6, wherein the transparent conductive layer comprises a metal oxide.

10. The organic light-emitting diode (OLED) device of claim 6, wherein the reflective conductive layer comprises a metal or metal alloy.

11. The organic light-emitting diode (OLED) device of claim 6, wherein the first transparent conductive layer is continuous across the extent of the organic light-emitting layer.

12. The organic light-emitting diode (OLED) device of claim 1, wherein one of the first and second electrodes comprises reflective and transparent portions in the light emissive area, and the other of the first and second electrodes comprises a reflective electrode across the extent of the light-emissive area.

13. The organic light-emitting diode (OLED) device of claim 1, further comprising a scattering layer optically integrated with the first and second electrodes and the organic layers.

14. The organic light-emitting diode (OLED) device of claim 13, wherein the scattering layer is formed only in areas aligned with the transparent portions.

15. The organic light-emitting diode (OLED) device of claim 13, wherein one of the first and second electrodes comprises reflective and transparent portions in the light emissive area, and the other of the first and second electrodes comprises a reflective electrode across the extent of the light-emissive area, and wherein the reflective electrode comprises at least two layers, a first transparent layer located on the side nearest the organic layer(s) and a second reflective layer located away from the organic layer(s), and wherein the scattering layer is located between the first transparent layer and the second reflective layer.

16. The organic light-emitting diode (OLED) device of claim 13, wherein at least one of the first and second electrodes is a scattering electrode.

17. The organic light-emitting diode (OLED) device of claim 13, wherein the transparent portion and layers of organic material have a first refractive index range, further comprising a transparent cover or substrate through which light from the OLED is emitted, the cover or substrate having a second refractive index; and wherein the reflective portion is thicker than the transparent portion, providing spacing between the transparent portion and the cover or substrate, and further comprising a low-index element in the spacing between the transparent portion and the cover or substrate, the low-index element having a third refractive index lower than each of the first refractive index range and second refractive index.

18. The organic light-emitting diode (OLED) device of claim 1, wherein transparent portions are equal to or greater than 1 micron in at least one dimension.

19. The organic light-emitting diode (OLED) device of claim 1, further comprising color filters aligned with the transparent portions.

20. The organic light-emitting diode (OLED) device of claim 1, comprising multiple light-emissive areas and wherein the transparent portions are not regularly aligned with the light emissive areas.

* * * * *